United States Patent [19]

Miller

[11] 4,418,858
[45] Dec. 6, 1983

[54] DEEP BONDING METHODS AND APPARATUS

[76] Inventor: C. Fredrick Miller, 2165 N. Glassell, Orange, Calif. 92665

[21] Appl. No.: 227,806

[22] Filed: Jan. 23, 1981

[51] Int. Cl.$^3$ .......................................... H01L 21/90
[52] U.S. Cl. ................................. 228/159; 228/4.5; 228/44.1 A; 228/179
[58] Field of Search ................... 228/4.5, 1 R, 44.1 A, 228/179, 159

[56] References Cited

U.S. PATENT DOCUMENTS

| 3,128,649 | 4/1964 | Avila et al. ...................... 228/4.5 X |
| 3,460,238 | 8/1969 | Christy et al. .................. 228/159 X |
| 4,266,710 | 5/1981 | Bilane et al. ......................... 228/4.5 |

FOREIGN PATENT DOCUMENTS

| 55-83244 | 6/1980 | Japan ..................................... 228/4.5 |
| 725845 | 4/1980 | U.S.S.R. ......................... 228/44.1 A |

Primary Examiner—Kenneth J. Ramsey
Attorney, Agent, or Firm—Grover A. Frater

[57] ABSTRACT

To permit accomplishment of wire bonding at a depth that precludes the use of the conventional clamp adjacent to the bonding tool, a new tool is provided which includes a means for preventing bowing of the wire and a method of using such a tool which substantially obviates any need to feed wire by pushing. The bond is completed at the second circuit point after a special motion which pays out a length of wire sufficient to maintain a loop of wire between the first and second bond points. Another special motion breaks the wire after the second bond and positions and shapes the wire end for making another initial bond.

10 Claims, 9 Drawing Figures

STEP TO SECOND BOND POSITION AND BOND

BREAK BOND

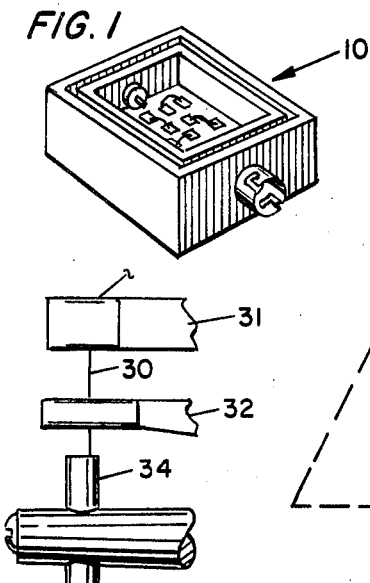
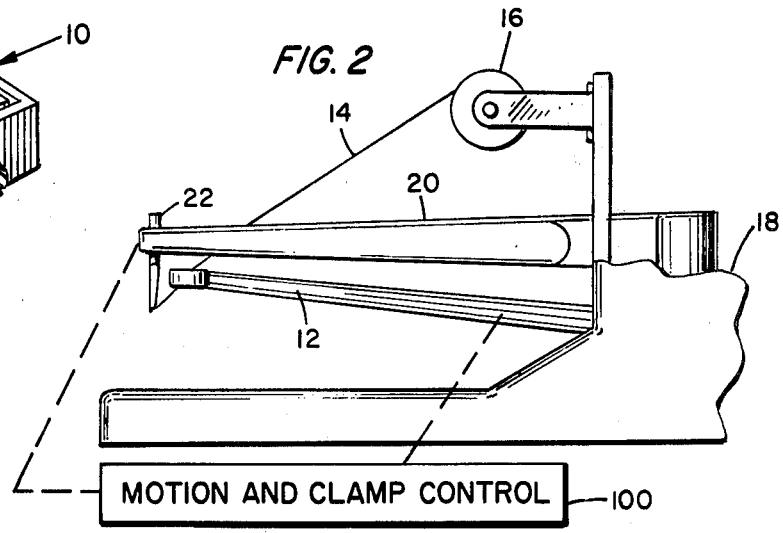
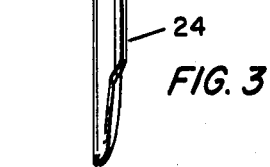
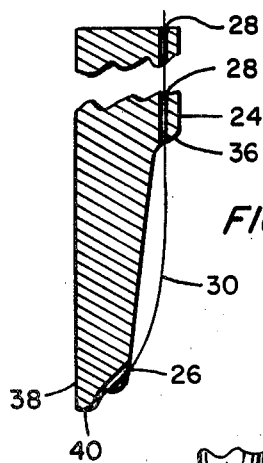
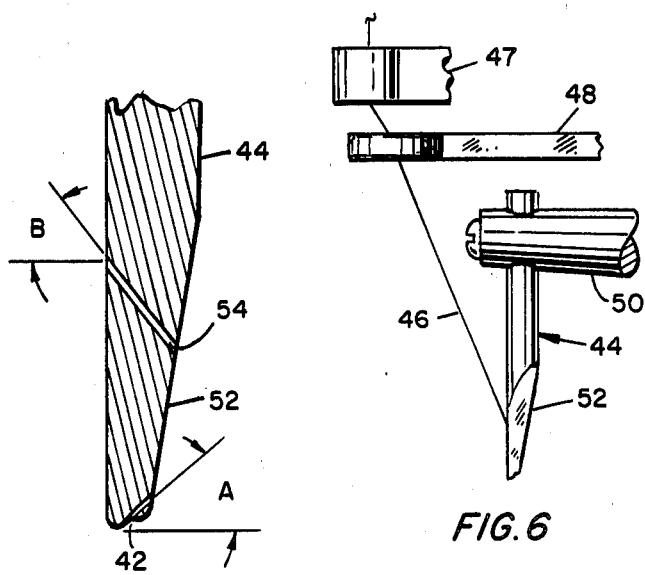
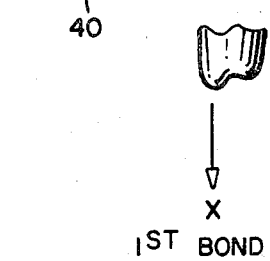
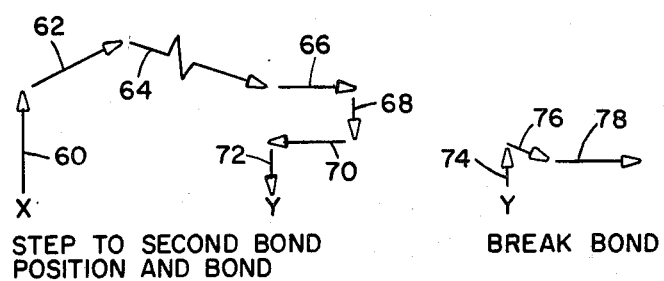

DEEP BONDING METHODS AND APPARATUS

TECHNICAL FIELD

This invention relates to methods and to apparatus for completing wire bond, usually in electronic apparatus, at a point which is located at a level substantially below the level of some obstruction.

DESCRIPTION OF THE PRIOR ART

Wire bonding is the term employed to describe the process by which electric circuit points are interconnected by connecting one end of a wire to one point and the other end, or a point along the wire, to another point. The term is usually reserved for the description of an interconnection process practiced on electronic apparatus with very fine wires. In a typical case, an aluminum or gold wire 1/1000ths of an inch in diameter may be connected between circuit paths on an integrated circuit chip of only 3- or 4/1000ths of an inch square, or between such a pad and an external circuit point.

Most integrated circuit chips are mounted in a package that has connectors with which the discrete integrated circuit package may be interconnected with other electronic circuitry. When building discrete packages of that kind, it is usually a simple task to arrange the structure so that the circuit paths are easily accessible. While there are a number of bonding techniques, one of the most widely used is cold welding accomplished by the bearing down on the wire with a sonically activated tool while the wire overlies the circuit point to which it is to be attached. The wire is attached at one circuit point after which a length of wire is payed out until the second circuit point is reached where a second bond is made after which the wire is severed behind the second bond. The length of the wire bond thus formed may vary from a few thousandths of an inch to a tenth of an inch or more, and the bond must be completed in a way so that the length of bonding wire clears intermediate structures and circuit runs and makes no electrical contact except at the bonding points. The circuit points, and even the wire, may be invisible to the unaided eye, so the bonding is accomplished with a machine which controls movement of the bonding tool and wire while the work is viewed by an operator through a stereo microscope.

The art of wire bonding has undergone continual development as the size of the wire and the size of circuit paths have become smaller. Special techniques are employed to ensure good bonding, avoidance of work hardening that can result in breakage, or the pulling loose of bonds when wire is payed out, paying out the wire in a manner to avoid short circuit connection with other structures, and so on. The state of the art apparatus and techniques for solving these problems and accomplishing wire bonding is described in U.S. Pat. No. 3,659,770 to Miller and in U.S. Pat. No. 4,068,371 to Miller.

Those several patents illustrate that it is the practice to complement use of the bonding tool with a wire feed apparatus which, as shown in those patents, usually comprises a tweezer-like clamp mounted adjacent the sonic welding tool. The clamp grasps the wire and moves it, particularly to accomplish feeding of the wire and to break the wire after having completed a circuit bond.

The pressure for greater miniaturization more and more is resulting in mounting of electronic circuit chips, not in their own discrete packages, but rather directly within the end package or housing of an electronic apparatus. It is not unusual, in a design of that kind, that the wire bonding points are located at a point below or behind some obstruction which precludes the use of the standard clamping arrangement. More particularly, it is often impossible to employ a clamp that is mounted below and behind the conventional sonic bonding tool. The sonic bonding tool structure involves a transfer from electrical to mechanical energy and requires matching of mechanical and electrical impedances. The most convenient and practical arrangement involves applying the bonding energy to the wire through a tool that is carried by a tapered impedance matching shaft that extends from the tool to the sonic transducer. The tool is ordinarily mounted in a hole that extends through the tapered shaft and perpendicular to its longitudinal axis. The anvil end of the tool in a typical case will lie one-fourth of an inch below the tapered shaft. The anvil of such a tool can reach a bonding point one-fourth inch below a housing wall or other obstruction in an electronic package only if the clamp is removed. Removal of the clamp gives rise to a very difficult problem. How can an aluminum or gold wire only one thousandsths of an inch in diameter, or even less, be properly fed and pulled and broken, and still be properly positioned under an anvil only two or three thousandths of an inch square, and over a circuit pad only three thousandths of an inch square, if it cannot be grasped except at a point more than one-fourth inch from its end. Inability to use the clamp means that the standard techniques which have evolved over a period of more than a decade are no longer applicable. New tools or new techniques, or both, are required, and it is an object of this invention to provide both.

DISCLOSURE OF INVENTION

It is an object of this invention to provide an improved apparatus and an improved method for accomplishing miniature scale wire bonding in circumstances in which the conventional wire control clamp cannot be employed.

A related object is to provide a wire bonding tool and method in which less reliance is placed on specialized wire clamping and clamp motion techniques.

The bonding tool and tapered impedance coupling rod have become standard in the wire bonding machine industry. Any attempt to modify the basic arrangement to permit deep bonding would have major financial consequences. An ideal solution to deep bonding would preserve the basic sonic energy system. An object of this invention is to provide such a solution. In the invention the clamp element is located above the sonic energy transmission rod, a change that presents little technical problems, and the bonding tool itself is changed.

In addition, there are procedural changes. The basic problem is that the bond wire cannot be pushed. Instead, the wire positioning and breaking operations must be conducted by pulling on the wire. That means that the positioning and the control and the breaking of a wire whose thickness is only a fraction of that of a human hair must be controlled relative to the position of a sonic welding anvil two or three thousandths of an inch square and a connection pad which may be only three to four thousandths of an inch square. To be able to perform those tasks properly with little or no reliance on pushing it another object of the invention.

These several objects, and other objects and advantages of the invention which will appear upon an examination of the preferred embodiments, are accomplished by providing a guiding means along the length of the sonic bonding tool for preventing the wire from becoming bowed as the tool moves toward the second bodning position. Movement of the tool from the first to the second bonding position is controlled in a sequence of steps that ensures that the finished wire bond will be looped upwardly whereby to prevent engagement with other structural features and possible short circuiting along its length. The sequence of tool movements ensures also that the wire loop will be sufficiently stiff so that the loop will not sag with time. That result is accomplished by an initial upward motion, overrunning the second bond point, returning the tool to a position over the second bond point before the tool is lowered to complete the bond. A special motion of the tool is combined with operation of the wire clamp to ensure breakage of the wire in back of the second bond point and positioning of the wire end so that it is ready for use in completing another first bond.

BRIEF DESCRIPTION OF THE DRAWINGS

In the drawings:

FIG. 1 is an isometric view of an apparatus that requires the utilization of deep bonding techniques in its construction;

FIG. 2 is a diagram illustrating prior art wire bonding apparatus;

FIG. 3 is a view in side elevation of a portion of a bonding apparatus including a bonding tool according to the invention;

FIG. 4 is a cross-sectional view of a fragment of the bonding tool of FIG. 3;

FIG. 5 is a view in side elevation of a portion of a bonding apparatus including a bonding tool of alternate form in which the invention is embodied;

FIG. 6 is a cross-sectional view of a fragment of the bonding tool of FIG. 5; and FIGS. 7, 8 and 9 are diagrams which illustrate the method of the invention.

DESCRIPTION OF THE PREFERRED EMBODIMENTS

FIG. 1 is an isometric view of a preamplifier and mixer unit which is housed in a small metal box and which includes unpackaged integrated circuit elements, circuit points of which are to be wire bonded to printed circuit runs located several tenths of an inch below the upper margins of the box. The unit 10 of FIG. 1 is representative of applications for wire bonding which preclude the use of a clamping mechanism positioned below the sonic coupling arm as the arm 12 is shown to be in FIG. 2.

FIG. 2 represents somewhat schematically pertinent portions of a wire bonding machine designed to practice the state of the art wire bonding method. A very fine wire 14 is carried on a spool 16 which is rotatably mounted on the bonding machine frame 18. The wire is payed out from the spool and extends through an opening in the tapered sonic energy coupling element 20. The left end of that element is attached to a sonic transducer which is contained within the housing 18. The wire extends through a hole that slants downwardly and toward the outer end of the coupling element and is formed on the vertical center plane through the coupler. After emerging from the opening in the coupler, the wire passes between the arms of a clamp 12. One arm lies on either side of the wire, and the control mechanism back in the bonding machine housing operates the clamp arms tweezer-like to grasp and release the wire. Other mechanisms contained within the housing 18 are effective to move the clamp arms up and down and back and forth relative to the sonic coupler arm 20 and the tool 22. The tool is mounted at the end of the coupler, usually on its vertical center plane and extends downwardly from the tool for a distance which, in a typical case, would be about one-fourth of an inch. The shank of the tool is cylindrical. The lower end of the tool is ground to a four sided point. At its very end, the tool is formed with a wire feed hole that extends from an opening in the rear face of the tool to an opening in its lower face.

Those features are too small to be shown in FIG. 2, but they can be seen in some of the other figures which will be described below. The problem presented by the apparatus 10 of FIG. 1 is that the bonding structure shown in FIG. 2 cannot extend into the case sufficiently far to complete the bond. The arms of the clamp 12 come into contact with some elements of the work piece, in this case the wall of the housing, before the tool 22 can be seated on the bonding points. There are a number of very cogent reasons for not altering the basic form of the sonic energy coupler 22 or the manner in which the bonding tool is assembled to the coupler. Accordingly, if the coupler and the tool are to be used in completing the bond in an apparatus like that shown in FIG 1, the tweezer must be removed. Removing the tweezers removes the means for pushing or "feeding" wire through the feed hole of the tool and under the lower face of anvil of the tool. If the clamp is moved to a position above the sonic coupler arm 20, the wire 14 will be unsupported over the space from the wire feed hole in the coupler to the wire feed hole in the tool 22. Since the bonding wire is exceedingly thin it bends very easily and attempts to push long lengths of it simply fail or produce nonrepeatable results.

The problem can be solved by using an arrangement in which the wire is guided sufficiently to prevent bowing of the wire during the search for the second end position. Examples of suitable physical arrangements are shown in FIGS. 3 and 5. FIG. 4 is a cross-sectional view taken through that vertical plane of the tool 24 which contains feed hole 26 at the anvil end of the tool and the anti-bow feed hole 28 which extends through the shank of the tool. The central portion of that cross-sectional showing is broken away to permit use of a larger scale. The elements of FIG. 3 are greatly enlarged, and the tool is further enlarged in FIG. 4. In an actual apparatus, the tool 24 might be about one-sixteenth of an inch in diameter and three-eighths of an inch long. In FIG. 3, the wire 30 passes from the wire reel through a friction drag 31 which is conventional in form but is a new element in the system. It is fixed to the machine. Thereafter, the wire passes between the clamp arms one of which, 32, is shown. The wire then extends down through the anti-bow opening 28 of the shank 34. At the lower end of the tool 24, a part of the shank wall is ground away to form a shoulder 36. The anti-bow passage terminates in an opening at the face of that shoulder. Thereafter, the wire extends free for a distance of about ninety-thousandths of an inch to a point near the anvil end of the tool where it enters the feed opening 26. The wire 30 enters the feed opening at the rear face of the tool and it emerges at the lower face of the tool just behind the lower forward end of the tool which serves as an anvil and is numbered 38.

The shape of the lower end of the tube, and the arrangement of the feed hole, are not unlike the shape and feed hole arrangement in prior art tools. It can be observed that the end of the wire 30 terminates just below the anvil 38 and slightly forward of it. The end is numbered 40 for identification, and it is positioned properly for making the first bond, the bond at the first end of a wire that is going to be bonded to a first position and then payed out to a second position where a second point on the wire will be bonded. The lower end of the tool in FIG. 6 is similarly shaped. In FIG. 6 the bonding wire has been omitted for the sake of clarity. In FIG. 6 the construction lines and arrows represent the angle A which the axis of the feed hole 42 makes with the horizontal. It is not essential that the tool 22 of FIG. 2, or the tool 24 of FIGS. 3 and 4, or the tool 44 of FIGS. 5 and 6, be operated in the vertical position. However, most manufactureres of bonding machines move the tool in the vertical direction. This description of operation has assumed that orientation for convenience. It is industry practice to use an angle A between thirty and sixty degrees. Use of the smaller angle helps to ensure proper shaping of the wire after breakage and preparation for making a better and more reliable next first bond. However, use of the smaller angle A complicates the wire feed problem because the wire is driven through the feed hole more easily during the search for the second bond position.

In the embodiment of FIG. 5 the wire 46 is threaded through a friction drag 47 which is mounted on the machine frame and thence between the arms of a clamp 48, past the end of sonic coupling rod 50, and then downwardly past the forward side of the tube through an upper feed opening at the tapered end 52 of the tool, and then down the rear side of the tool to the lower feed opening. The upper feed opening at the tapered end of the tool is visible in the cross-sectional showing of FIG. 6 where it is identified by the reference numeral 54. It is formed on an angle B with the horizontal, and in the preferred embodiment that angle is about sixty degrees. At the rear face of the tool, the distance between the exit opening of feed passage 54 and the entry opening of the feed passage 42 are separated by a distance of seventy- to one hundred-thousandths of an inch in the preferred embodiment. The separation between the two openings, both in FIG. 4 and in the embodiment of FIG. 6, is relatively great notwithstanding that the object of these new contructions is to prevent bowing of the bond wire above the lower feed opening. The bonding wire is very thin and is easily twisted. If the distance between the two openings is too short, pulling the wire from a bond, especially when pulling from the second bond when the object is to break the wire, can result in pulling a loop into a tight twist. If the separation between the two openings is relatively great, pulling on the wire tends to remove the twist.

Whether the tool has the form shown in FIGS. 3 and 4, or the form shown in FIGS. 5 and 6, the condition of the wire at the end of the second bond, and after the wire has been broken, is substantially the condition that the wire is shown to have in FIG. 4. To complete a wire bond, or stitch, between two circuit points, the tool, or the work piece, is manipulated by conventional means that are incorporated in wire bonding tools so that the anvil of the tool will lie directly over the point at which the end of the wire, end 40 in FIG. 4, is to be bonded. When the tool has that position, it is lowered, as indicated by the arrow in FIG. 7. It is lowered vertically downward. The end of the wire touches the circuit point to which it is to be bonded. The tool continues its downward motion until the anvil engages the upper surface of the wire end. The downward motion of the tool continues in slight degree until a measured amount of pressure is applied to the wire. Sonic energy applied by the sonic transducer to the tool through the coupling rod 20 results in a bonding of the wire to the circuit point, or circuit pad. That having been done, the tool is moved in the manner depicted in FIG. 8. The first arrow in that figure is numbered 60. It indicates that the tool is lifted vertically from the first bond. Thereafter, the tool is stepped upwardly and rearwardly. Convention describes motion from the first bonding point to the second bonding point as a rearward motion. That motion is indicated by the arrow numbered 62. The length of the arrow is indicative of the amount of movement. In practical application, the amount of that movement will depend upon how tall a loop is to be made in the bonding wire between the first and second bond points. In most cases, that will be determined by the amount of separation between the first and second bond points and the presence of structures that must be cleared in making the bond. The third arrow 64 includes a symbol along its length to indicate that the length of that segment of tool movement is determined by the amount of separation between the first and second bond points. In the diagram, the first bond point is indicated with the symbol "X," and the second bond point is indicated with the symbol "Y." In some applications, the separation and the position of X and Y are known and the tool is moved automatically. In other circumstances, an operator searches through the stereo-microscope for the second bond point, and in such cases the motion indicated by arrow 64 includes the motions involved in the search operation. In either case, the tool is moved to a position directly over the second bond point and then it is retracted in a movement indicated by arrow 66. The next movement is represented by arrow 68 and it is a downward movement. The amount of that downward movement increases as the separation between the first and second bonding point is increased. When the separation is very small, that downward movement might be reduced to zero. The height of the loop is determined primarily by the first two steps, numbered 60 and 62 in FIG. 8. The bond having been made, the upward movement indicated by arrow 60 serves to bend the wire up immediately in back of the first bond. A small amount of work hardening results and the stiffness of the wire is increased. It tends to stand up vertically so that during the motion labelled 62, additional wire will be payed out in lieu of the initial length of wire simply being bent rearwardly. The motion 64 is a continuation of that second motion, although it can, and usually does, include a downward component. If, after moving the tool to a position over the second bonding point, it was simply to be lowered down to the second bonding point, much of the entire length of the wire would simply be bent downwardly and the wire would slope at a relatively small angle down to the second bond point. To prevent that, the tool is moved rearwardly as indicated by arrow 66 to pay out an additional length of wire. Then the tool is moved downwardly in step 68 to bring the wire in contact with the anvil at the lower forward face of the tool. That tends to bend the wire around the anvil and minimize the possibility that return of the tool to a position over the second bonding position will result in the wire being pushed back through the lower feed hole. The arrow 70 represents a step in which the tool, with the wire wrapped over its anvil, is moved forwardly to a position over the second bond point. During that motion the wire is pushed, but it is not the wire that is being fed to the tool that is pushed; instead, what is pushed is the wire that has previously been payed out from the tool. In the final step, indicated by arrow 72, the tool is lowered to the second bonding point. Again, the anvil presses down on the wire to force it into engagement with the second bonding point. Sonic energy completes the bond and the next task is to break the wire behind the second bond and to prepare the wire end for making the first bond of another wire connection.

In the preferred form of the invention, that step is accomplished in a series of motions that are depicted by the arrows 74, 76 and 78 in FIG. 9. Arrow 74 indicates that the tool is lifted vertically from the second bond point That has the effect of bending the wire upwardly just after the second bond point. Arrow 72 indicates that the wires then move downwardly and rearwardly. The effect is to bend the wire just in back of the second bond in the opposite direction. Thereafter, the tool is moved horizontally in the direction away from the bond. Just prior to or during the motion depicted by arrow 76 the clamp 48 in FIG. 5 and 32 in FIG. 3 is closed so that motion of the tool results in pulling on the wire rather than the pay out of wire. The motion at arrow 76 is such that the wire is bent just back of the bond but the separation between the bond and the tool does not increase very much, if at all. Breakage does not occur until the tool is moved as indicated in step 78. Thus, it is not essential that the wire be clamped during motion 76. However, it is preferred that the clamp be closed during motion 76. These machines are used on high volume, semiconductor fabrication lines. The degree of motion at the several steps can be, and is, adjusted by production technicians, and a new adjustment is made each time a different product is to be made. In that circumstance, it is better practice to control the wire as much as possible by clamping whenever it can be done.

FIGS. 7, 8 and 9 illustrate the method of the invention. Its salient features are nearly vertical, or at least substantially vertical, movement following the first bond. That movement is not novel in itself, but in the method it is not optional to the degree that is has been in prior methods. The succeeding movement, upward and away from the bond point, while not essential is much preferred in practicing the invention.

The combination of steps represented by arrows 66, 68 and 70 is new. In prior processes, loop height was preserved notwithstanding lowering of the second end of the wire to the bonding point by using the clamp either to feed wire during the course of loop making or to hold the wire from running through the feed passageway in the tool as the tube was returned to the second bonding position after having been run past that position to pay out an additional length of material. This method adds the down stroke represented by arrow 68, and it is that down stroke that permits omission of the wire clamping or wire clamping and feeding that characterises previous methods. The breaking step is also novel. In the prior art method it was possible to maintain pressure on the second bond with the tool while the clamp was used to grasp and pull the wire to break it. When the clamp is removed from the region of the anvil end of the bonding tool, pulling with the clamp is no longer feasible. That means that the tool movement must be relied on to break the wire and, of course, the tool cannot simultaneously rest on the bond to prevent destroying the bond as the wire is broken and, also, move the tool to accomplish breaking.

The apparatus which moves the tool and work relative to one another, and which operates the clamp, is labelled 100 in FIG. 2.

Although I have shown and described certain specific embodiments of my invention, I am fully away that many modifications thereof are possible. My invention, therefore, is not to be restricted except insofar as is necessitated by the prior art.

I claim:

1. A deep bonding tool for use in a sonic, wire bonding machine, said tool comprising:
   a body including a shank section;
   a tapered section extending from the shank section to an end which is smaller in cross-sectional area than the shank section;
   said end being formed with a first anvil-shaped end portion extending beyond a second end portion;
   a wire feed hole of size to accommodate a bonding wire and extending from a first opening at said end of the body between said first anvil-shaped end portion and said second end portion to a second opening at the side of said body in said tapered section; and
   wire bow preventing means for cooperation with said feed hole to prevent lateral bowing of the wire at the side of the feed hole toward said shank when the wire is forced in the direction toward said feed hole, said bow preventing means being formed as a passage of size to accommodate the bonding wire and extending through the shank of the tool and an opening at the juncture of said tapered section and said shank section.

2. A deep bonding tool for use in a sonic, wire bonding machine, said tool comprising:
   a body including a shank section;
   a tapered section extending from the shank section to an end which is smaller in cross-sectional area than the shank section;
   said end being formed with a first anvil-shaped end portion extending beyond a second end portion;
   a passageway of size to accommodate a bonding wire and extending from a first opening at said end of the body between said first anvil-shaped end portion and said second end portion to a second opening at the side of said body in said tapered section;
   wire bow preventing means for limiting lateral movement of said wire and restricting movement of the wire in the direction of its length in the region of said second opening;
   said wire bow preventing means comprising a second passageway of size to accommodate the bonding wire, said second passageway being formed along a direction different from the direction of said first mentioned passageway such that the wire is bent in moving from the second passageway into said first mentioned passageway; and
   said second passageway extending obliquely through the tapered section of the tool such that openings at the end of the tool lie on opposite sides of said tapered section with the opening nearest said first mentioned opening being positioned on the side of said tapered section in which said second opening of the first mentioned passageway is formed.

3. The invention defined in claim 2 in which said first mentioned passageway comprises a bore the axis of which is within five degrees of sixty degrees from the direction of the longitudinal center line of the tool.

4. The invention defined in claim 3 in which the second passageway comprises a bore the axis of which is within five degrees of thirty degrees from the direction of the longitudinal center line of the tool.

5. The method of controlling wire position in a sonic bonding machine while accomplishing bonding which bonding machine comprises a tool and a clamp, and in which said tool comprises a shank section connected to a tapered section ending in an anvil end, a wire feed hole extending from a first opening at the tool end to a second opening at the side of said tapered section, and a wire extending through said wire feed hole, which method comprises the steps of:
while the end of the bonding wire underlies the anvil end of the tool, lowering the tool and wire end to a first circuit connection point and there completing a bond of the wire end to the first circuit point;
lifting the tool substantially vertically while the end of the wire remains bonded to the first circuit point such that the tool is pulled along the wire until a length of wire extends substantially vertically from one side of said bond;
thereafter lifting the tool vertically and laterally in a plane that contains said length of wire while the end of the wire remains bonded to said first circuit point;
thereafter moving said tool such that it passes over a second circuit point while permitting the tool to move relative to the position of the wire that extends through the feed hole while preventing bowing of the wire at the side of said feed hole away from said first circuit point;
thereafter moving the tool substantially horizontally from a position over the second bond point in the direction away from said first circuit point while permitting the tool to move relative to that portion of the wire that extends through the feed hole;
thereafter, while preventing the wire from bowing at the side of the feed hole away from said circuit point, moving the tool substantially vertically downwardly and then substantially horizontally in the direction of said second circuit point and then downwardly to said second circuit point; and
completing a bond of the wire to said second circuit point.

6. The invention defined in claim 5 which comprises the further step of:
breaking the wire adjacent said second point after pulling out a length of wire sufficient to underlie said anvil end and bending the end of the wire under the anvil end by raising the tool vertically from the second bond point while permitting the tool to move over the wire relative to the wire in said feed hole;
thereafter moving the tool downwardly and away from the second circuit point; and
thereafter moving the tool away from said second circuit point while holding the wire against motion relative to the tool at said feed hole.

7. In a wire bonding process conducted with a sonic bonding tool having an anvil end and a feed hole for a bonding wire which extends through the feed hole and emerges at the anvil end of the tool and in which the wire is to be broken, after being bonded to a second circuit point, the step of breaking the wire adjacent said second point by;
pulling out a length of wire sufficient to underlie said anvil end and bending the end of the wire under the anvil end by raising the tool vertically from the second bond point while permitting the tool to move over the wire relative to the wire on said feed hole;
thereafter moving the tool downwardly and away from and not toward the second circuit point; and
thereafter moving the tool away from said second circuit point while holding the wire against motion relative to the tool at said feed hole.

8. In a machine for sonically bonding a wire such that it extends from a bond at a first circuit point to a second circuit point in the circumstance in which the wire is not to be fed to the work by being pushed, in combination:
a sonic transducer coupled to a coupling rod which rod carries a bonding tool which tool extends from the rod and ends in an anvil structure having a feed hole extending through the tool from a point adjacent the anvil structure;
a wire;
means for leading a length of said wire through said feed hole to a point below said anvil structure from a point above said coupling rod;
means located on the side of said coupling rod opposite the anvil structure of the tool for holding said wire against motion relative to the tool at said feed hole; and
means for moving the tool upwardly from the second circuit point for a distance while permitting relative movement between the wire and tool at the feed hole, and thereafter in a direction simultaneously downwardly and away from said second circuit point, and thereafter in a direction away from said second bonding point while holding the wire against motion relative to the tool at said feed hole until the wire is broken.

9. The invention defined in claim 8 in which said feed hole in the tool extends at an angle from the lower end of the tool adjacent said anvil to an opening at the side of said tool.

10. The invention defined in claim 9 in which the combination of tool and rod includes means for permitting the wire to move in the direction of its length while substantially precluding lateral bowing motion relative to the tool over the length of the tool.

* * * * *